United States Patent
Ho

(10) Patent No.: US 11,049,781 B1
(45) Date of Patent: Jun. 29, 2021

(54) CHIP-SCALE PACKAGE DEVICE

(71) Applicant: PANJIT INTERNATIONAL INC., Kaohsiung (TW)

(72) Inventor: Chung-Hsiung Ho, Kaohsiung (TW)

(73) Assignee: PANJIT INTERNATIONAL INC., Kaohsiung (TW)

( * ) Notice: Subject to any disclaimer, the term of this patent is extended or adjusted under 35 U.S.C. 154(b) by 0 days.

(21) Appl. No.: 16/789,518

(22) Filed: Feb. 13, 2020

(51) Int. Cl.
| | |
|---|---|
| *H01L 23/31* | (2006.01) |
| *H01L 23/13* | (2006.01) |
| *H01L 23/498* | (2006.01) |
| *H01L 23/00* | (2006.01) |
| *H01L 23/14* | (2006.01) |
| *H01L 21/48* | (2006.01) |

(52) U.S. Cl.
CPC ...... *H01L 23/3114* (2013.01); *H01L 21/4857* (2013.01); *H01L 23/13* (2013.01); *H01L 23/142* (2013.01); *H01L 23/3121* (2013.01); *H01L 23/49811* (2013.01); *H01L 23/49822* (2013.01); *H01L 24/19* (2013.01); *H01L 24/20* (2013.01)

(58) Field of Classification Search
CPC ... H01L 21/4857; H01L 23/13; H01L 23/142; H01L 23/3114; H01L 23/3121; H01L 23/49811; H01L 23/49822; H01L 24/20
See application file for complete search history.

(56) References Cited

U.S. PATENT DOCUMENTS

| | | | |
|---|---|---|---|
| 6,709,898 B1 | 3/2004 | Ma et al. | |
| 2016/0064329 A1* | 3/2016 | Lee | H01L 23/5383 257/659 |
| 2018/0366403 A1* | 12/2018 | Yu | H01L 23/5389 |

FOREIGN PATENT DOCUMENTS

| | | |
|---|---|---|
| TW | 201126619 A | 8/2011 |
| TW | 201935643 A | 9/2019 |
| TW | 201941672 A | 10/2019 |

OTHER PUBLICATIONS

Search Report appended to an Office Action, which was issued to Taiwanese counterpart application No. 108138231 by the TIPO dated Jun. 2, 2020, with an English translation thereof.

* cited by examiner

*Primary Examiner* — Allan R Wilson
(74) *Attorney, Agent, or Firm* — McNees Wallace & Nurick LLC

(57) ABSTRACT

A chip-scale package device includes a substrate unit, a chip unit, and an electrical insulator. The substrate unit has opposite first and second surfaces, and a receiving space defined by a space-defining surface. The chip unit is disposed in the receiving space, and includes a chip and first and second electrodes disposed oppositely on the chip. The electric insulator fills the receiving space to cover the space-defining surface and the chip unit and to expose the first electrode. The first and second surfaces and the space-defining surface are electrically connected to one another, and the second electrode is electrically connected to the space-defining surface.

9 Claims, 10 Drawing Sheets

CHIP-SCALE PACKAGE DEVICE

FIELD

This disclosure relates to a package device, and more particularly to a chip-scale package device.

BACKGROUND

A conventional package device usually uses a lead frame for holding a semiconductor chip (e.g., a diode or a transistor) and electrically connects the lead frame to electrodes of the semiconductor chip using wire bonds. The lead frame, the semiconductor chip, and the wire bonds are then encapsulated by an encapsulation layer with the lead frame being partially exposed. In the conventional package device, electric signals generated by the semiconductor chip is transmitted to the exposed portion of the lead frame through the wire bonds, and then transmitted to outside of the package device. It is also common in this field of art to replace the wire bonds with solders.

As shown in FIG. 1, a conventional wireless package device 1 includes a lead frame unit 11, a chip unit 12, a solder unit 13, and an encapsulation layer 14. The lead frame unit 11 includes an upper frame 112 and a lower frame 111. The chip unit 12 is disposed on the lower frame 111 of the lead frame unit 11, and includes a chip 120, a top electrode 121 disposed on top of the chip 120, and a bottom electrode 122 disposed at the bottom of the chip 120. The solder unit 13 includes a first solder 131 which interconnects the top electrode 121 and the upper frame 112, and a second solder 132 which interconnects the bottom electrode 122 and the lower frame 111. The encapsulation layer 14 encapsulates the lead frame unit 11, the chip unit 12, and the solder unit 13, and the upper and lower frames 112, 111 are partially exposed from the encapsulation layer 14.

During manufacturing of the conventional wireless package device 1, a hot pressing process is conducted. Since each of the upper and lower frames 112, 111 has a cantilever structure, during the hot pressing process, the upper and lower frames 112, 111 may suffer from elastic deflection under a high pressure imposed by a hot pressing machine, and reflow of the solder may occur under a high temperature. The elastic deflection and the solder reflow may result in tilting of the chip unit 12. Further, the encapsulation layer 14 is usually made of a polymeric material, which is disadvantageous for reducing electromagnetic interference caused by external environments to the chip unit 12. Moreover, such conventional wireless package devices may not meet the industrial requirements for miniature structure of a portable electronic device.

SUMMARY

Therefore, an object of the disclosure is to provide a chip-scale package device that can alleviate at least one of the drawbacks of the prior art.

According to the disclosure, a chip-scale package device includes a substrate unit, a chip unit, and an electrical insulator. The substrate unit has a first surface, a second surface opposite to the first surface, and a receiving space which is an indentation extending from the first surface toward the second surface and which is defined by a space-defining surface. The chip unit is disposed in the receiving space and surrounded by the space-defining surface. The chip unit includes a chip, and first and second electrodes disposed oppositely on the chip. The electrical insulator fills the receiving space to cover the space-defining surface and the chip unit such that the first electrode is exposed from the electrical insulator. The first surface, the second surface, and the space-defining surface are electrically connected to one another, and the second electrode is electrically connected to the space-defining surface.

BRIEF DESCRIPTION OF THE DRAWINGS

Other features and advantages of the disclosure will become apparent in the following detailed description of the embodiments with reference to the accompanying drawings, in which.

DETAILED DESCRIPTION

Figure 1:
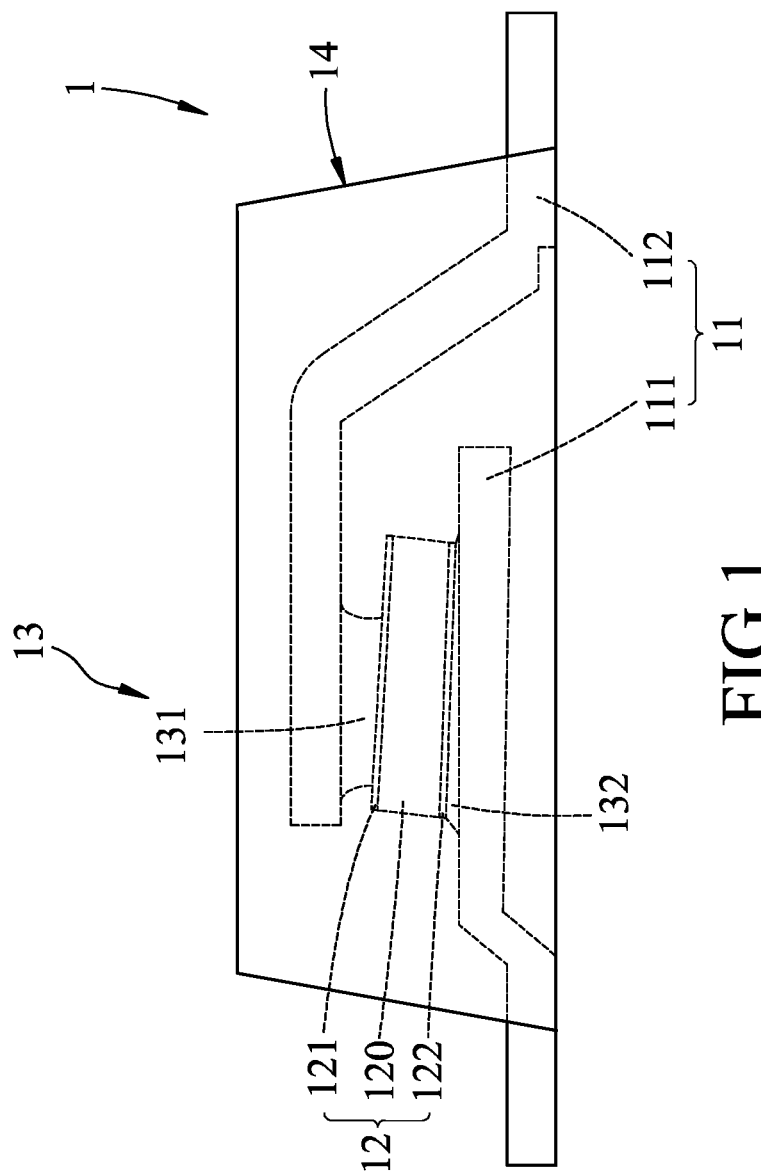
FIG. 1 is a schematic front view of a conventional wireless package device.

Before the disclosure is described in greater detail, it should be noted that where considered appropriate, reference numerals have been repeated among the figures to indicate corresponding or analogous elements, which may optionally have similar characteristics.

Figure 2:
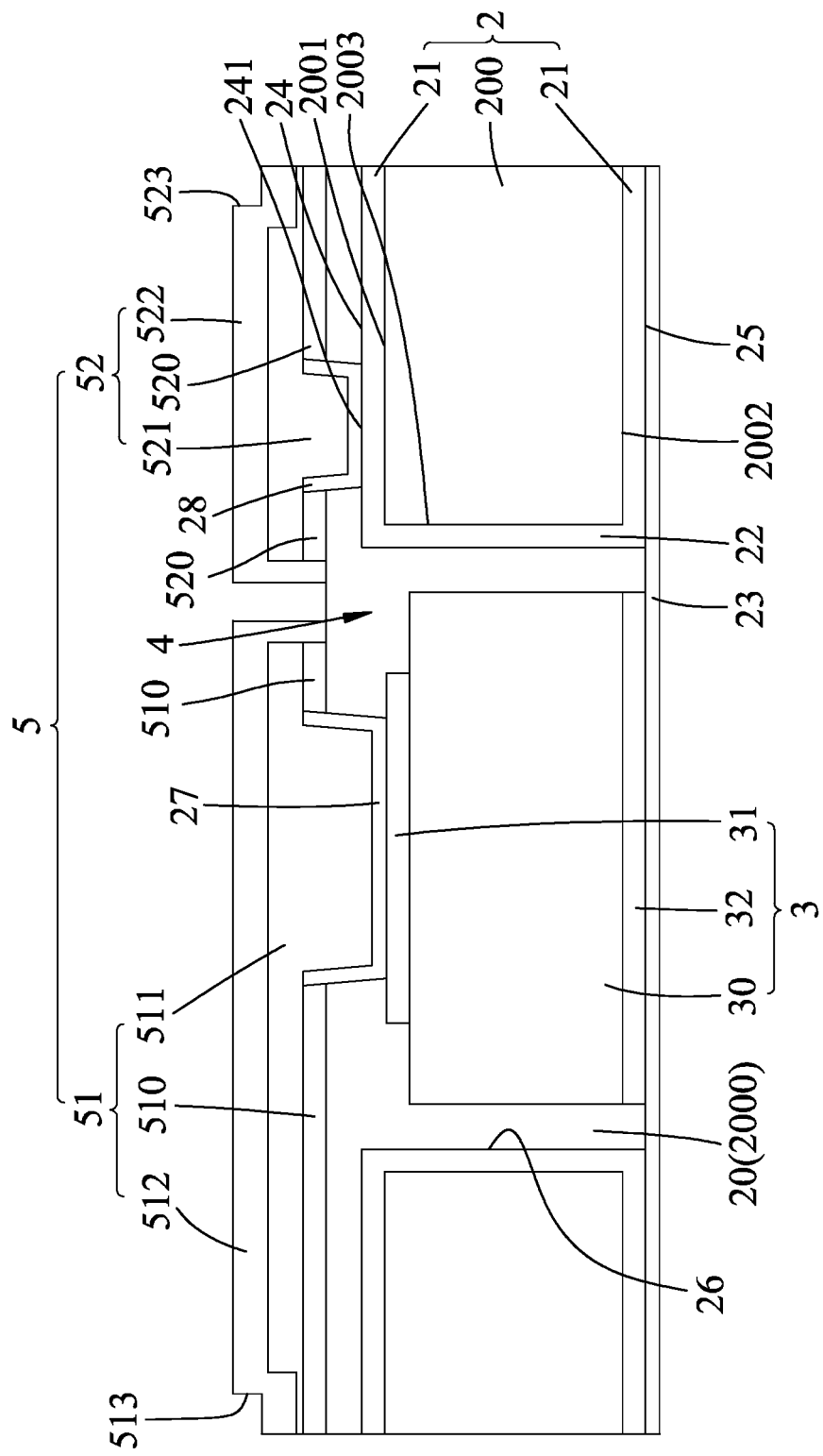
FIG. 2 is a schematic front view of a first embodiment of the chip-scale package device according to the disclosure.

As shown in FIG. 2, a first embodiment of a chip-scale package device according to the disclosure includes a substrate unit 2, a chip unit 3, and an electrical insulator 4.

The substrate unit 2 has a first surface 24, a second surface 25 opposite to the first surface 24, and a receiving space 20 which is an indentation extending from the first surface 24 toward the second surface 25 and which is defined by a space-defining surface 26. The first surface 24, the second surface 25, and the space-defining surface 26 are electrically connected to one another.

The chip unit 3 is disposed in the receiving space 20 and surrounded by the space-defining surface 26. The chip unit 3 includes a chip 30 and first and second electrodes 31, 32 disposed oppositely on the chip 30. The second electrode 32 is electrically connected to the space-defining surface 26.

The electrical insulator 4 fills the receiving space 20 to cover the space-defining surface 26 and the chip unit 3 such that the first electrode 31 is exposed from the electrical insulator 4.

In an embodiment, the electrical insulator 4 partially covers the first surface 24 so that the first surface 24 has an exposed region 241 in proximity to the receiving space 20 and exposed from the electrical insulator 4. The chip-scale package device further includes an electrode pad unit 5 having spaced-apart first and second electrode pads 51, 52. The first electrode pad 51 covers and electrically connects with the first electrode 31 exposed from the electrical insulator 4, and the second electrode pad 52 covers and electrically connects with the exposed region 241 of the first surface 24 (see FIG. 2).

In an embodiment, the substrate unit 2 includes an insulating layer 200, a first metal layer 21, a second metal layer 22, and a third metal layer 23. The insulating layer 200 has opposite upper and lower surfaces 2001, 2002, and a through hole 2000 extending through the upper and lower surfaces 2001, 2002 (see FIG. 2). The through hole 2000 is defined by a hole-defining surface 2003 that interconnects the upper and lower surfaces 2001, 2002. The first metal layer 21 covers the upper and lower surfaces 2001, 2002 of the insulating layer 200 and defines the first and second surfaces 24, 25 of the substrate unit 2. The second metal layer 22 covers the hole-defining surface 2003 of the insulating layer 200, and connects with the first metal layer 21 on the upper and lower surfaces 2001, 2002. The third metal layer 23 connects to the second metal layer 22 and the first metal layer 21 formed on the lower surface 2002 of the insulating layer 200. The third metal layer 23 also connects to the second electrode 32 so that the second electrode 32 is electrically connected to the first, second and third metal layers 21, 22, 23. The second metal layer 22 and the third metal layer 23 cooperatively define the space-defining surface 26 of the substrate unit 2, and therefore the first surface 24, the second surface 25, and the space-defining surface 26 are electrically connected. The first metal layer 21, the second metal layer 22, and the third metal layer 23 may be made of any electrically conductive metal, such as titanium, copper, steel, aluminum, nickel, gold, and combinations thereof, but are not limited thereto.

In an embodiment, the chip-scale package device further includes a fourth metal layer 27 disposed between the first electrode 31 and the first electrode pad 51, and a fifth metal layer 28 disposed between the exposed region 241 and the second electrode pad 52 (see FIG. 2). As shown in FIG. 2, the first electrode pad 51 covers the fourth metal layer 27 and a portion of the electrical insulator 4, and second electrode pad 52 covers the fifth metal layer 28 and another portion of the electrical insulator 4.

In an embodiment, each of the first and second electrode pads 51, 52 includes a metal foil 510, 520, a first solder layer 511, 521 stacked on the metal foil 510, 520, and a second solder layer 512, 522 stacked on the first solder layer 511, 521. The metal foil 510 of the first electrode pad 51 is disposed on the electrical insulator 4 and connected to the fourth metal layer 27. The metal foil 520 of the second electrode pad 52 is disposed on the electrical insulator 4 and connected to the fifth metal layer 28 (see FIG. 2). In certain embodiments, each of the metal foils 510, 520, and each of the first solder layers 511, 521 may be made of copper (Cu), and each of the second solder layers 512, 522 may be made of tin (Sn).

In an embodiment, each of the first and second electrode pads 51, 52 has an indentation 513, 523 indented toward the substrate unit 2 (see FIG. 2). In an embodiment, the indentations 513, 523 of the first and second electrode pads 51, 52 are located at a periphery of the chip-scale package device.

A method for producing the first embodiment of the chip-scale package of the disclosure is illustrated in FIGS. 3 to 6.

Figure 3:
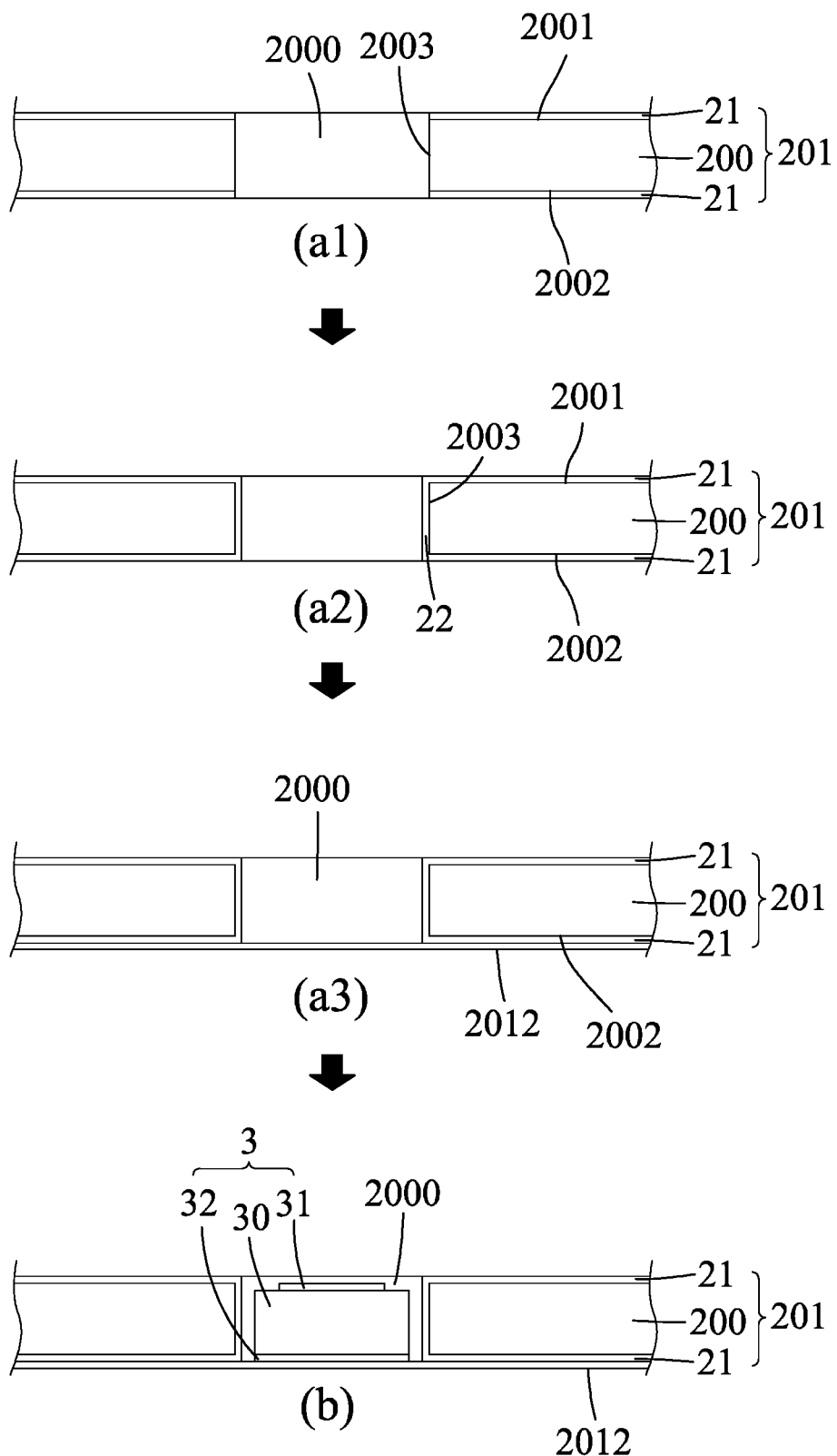
FIGS. 3 to 6 are schematic views illustrating consecutive steps for producing the first embodiment of the chip-scale package device.

As shown in FIG. 3, in step a1), a laminate 201 having the insulating layer 200 and the first metal layer 21 on the upper and lower surfaces 2001, 2002 of the insulating layer 200 is formed with the through hole 2000 defined by the hole-defining surface 2003. In an embodiment, formation of the through hole 2000 is conducted by a laser ablation technique. In step a2), the second metal layer 22 is formed on and cover the hole-defining surface 2003 to connect with the first metal layer 21 on the upper and lower surfaces 2001, 2002 of the insulating layer 200. Then, in step a3), a plastic film 2012 is formed on the first metal layer 21 on the lower surface 2002 of the insulating layer 200 to cover a bottom opening of the through hole 2000. After this, in step b), the chip unit 3 is disposed in the through hole 2000 such that the second electrode 32 is disposed on and contacts the plastic film 2012.

Figure 4:
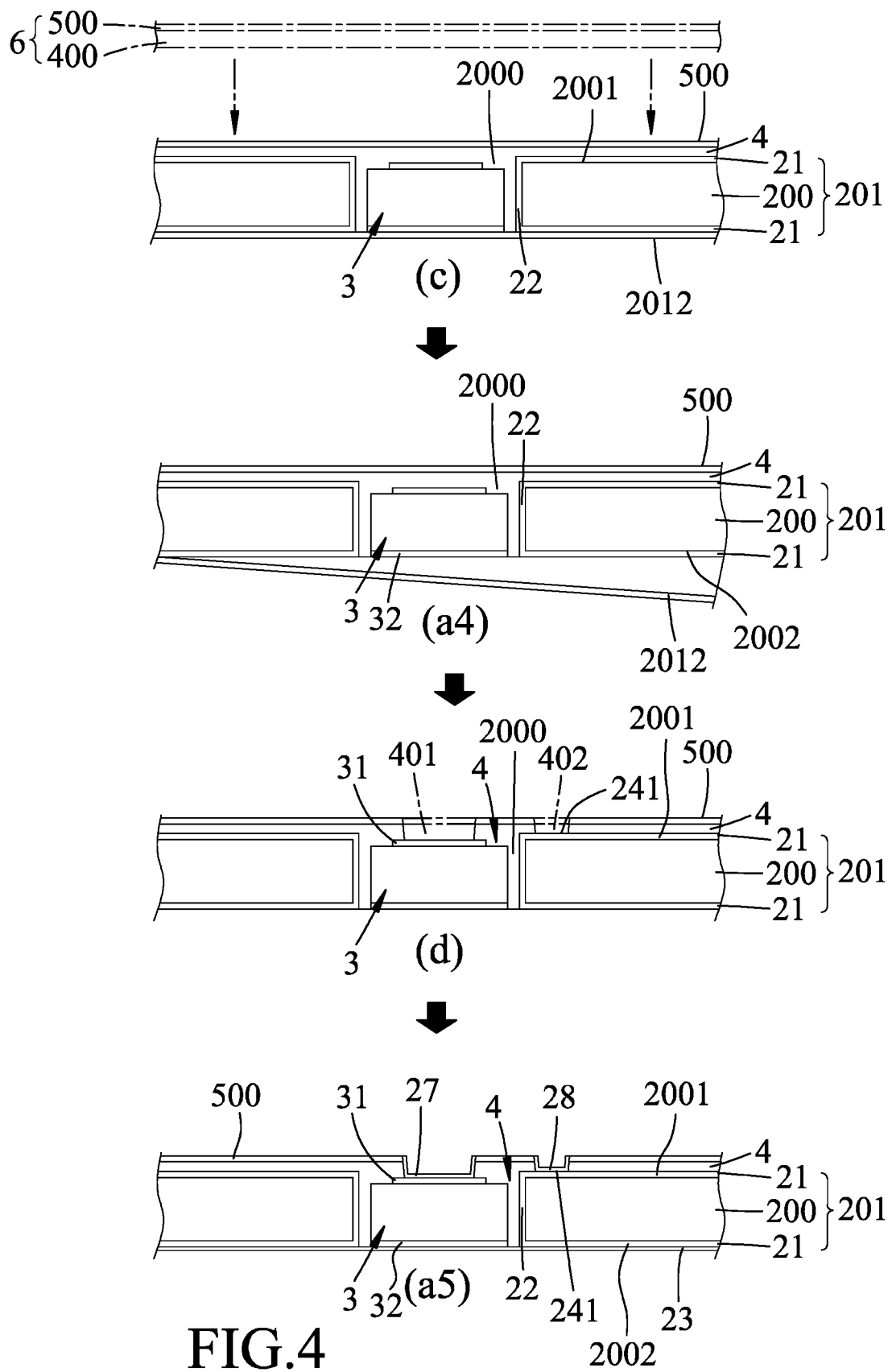

As shown in FIG. 4, in step c), after the chip unit 3 is disposed in the through hole 2000, the electrical insulator 4 is injected into the through hole 2000 to cover the second metal layer 22 and the chip unit 3, and to seal a top opening of the through hole 2000. In certain embodiments, the electrical insulator 4 is formed by injecting a polymer material or by hot pressing a film structure 6. As shown in FIG. 4, the film structure 6 includes a polymeric prepreg 400 and a metal foil 500 (e.g., copper foil) stacked on the polymeric prepreg 400. During the hot pressing procedure, the polymeric prepreg 400 is deformed to fill the through hole 2000 and solidifies to form the electrical insulator 4. The electrical insulator 4 also covers the first metal layer 21 formed on the upper surface 2001 of the insulating layer 200.

Subsequently, in step a4), the plastic film 2012 is removed so that the first metal layer 21 on the lower surface 2002 of the insulating layer 200, a portion of the second metal layer 22 immediately connected with the first metal layer 21, and the second electrode 32 are exposed from the electric insulator 4. In step d), a first portion 401 of the electric insulator 4 is then removed to expose the first electrode 31 of the chip unit 3. A second portion 402 of the electric insulator 4 is also removed to expose the exposed region 241 of the first metal layer 21 on the upper surface 2001 of the insulating layer 200. The first and second portions 401, 402 of the electric insulator 4 may be removed by a laser ablation technique.

In step a5), after step (d), the third metal layer 23 is formed on the second electrode 32 and the first metal layer 21 on the lower surface 2002 of the insulating layer 200 so that the second electrode 32 can be electrically connected to the first and second metal layers 21, 22 through the third metal layer 23. In certain embodiments, the third metal layer 23 may be formed by chemical plating or sputtering. In addition, the fourth metal layer 27 is formed on the first electrode 31 and a portion of the electric insulator 4 adjacent to the first electrode 31 so that the fourth metal layer 27 is connected with the metal foil 500. The fifth metal layer 28 is formed on the exposed region 241 of the first metal layer 21 on the upper surface 2001 of the insulating layer 200 and a portion of the electric insulator 4 adjacent to the exposed region 241 so that the fifth metal layer 28 is connected with the metal foil 500.

Figure 5:
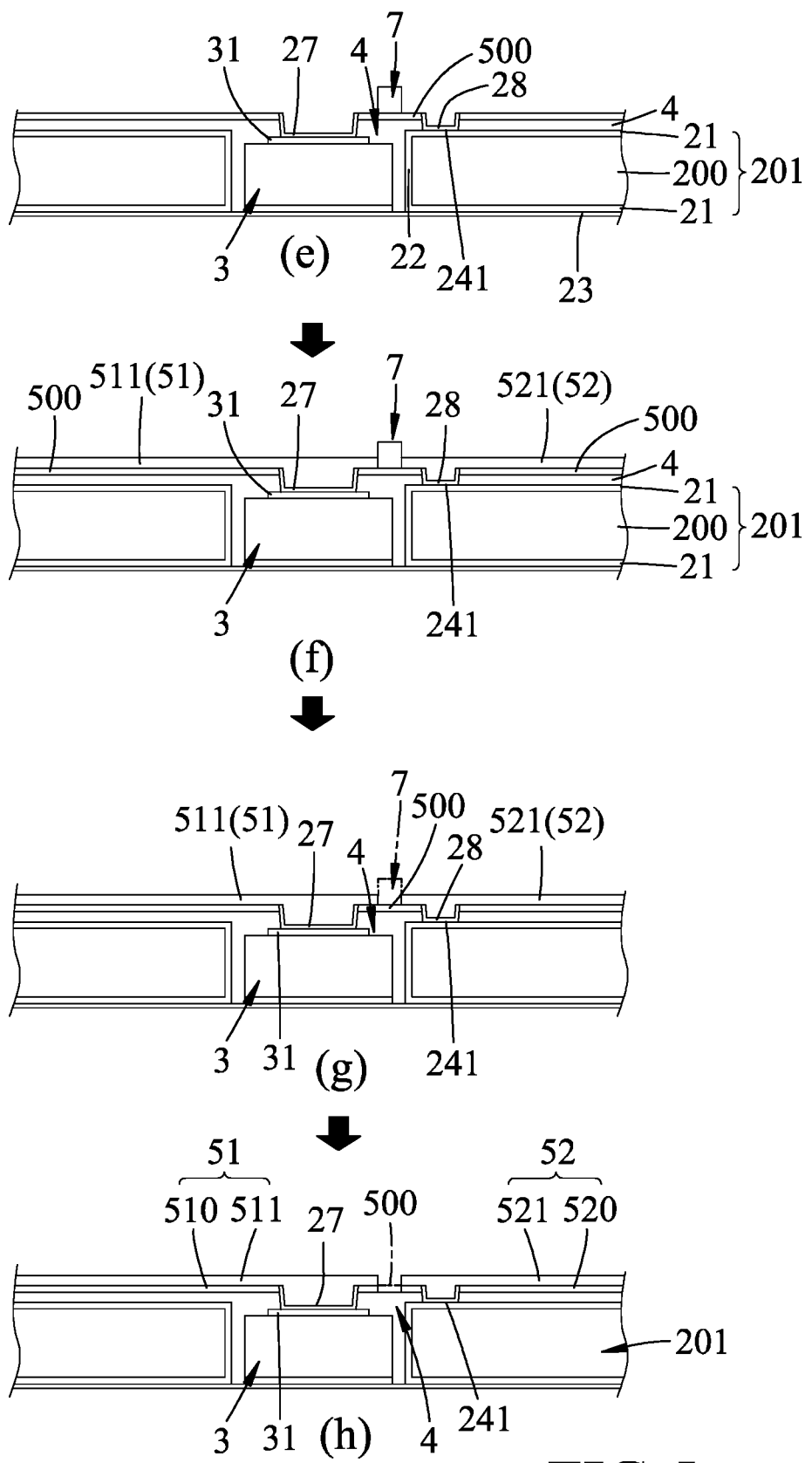

Subsequently, as shown in FIG. 5, in step e), a photoresist layer 7 is formed on a portion of the metal foil 500 located between the fourth metal layer 27 and the fifth metal layer 28 by, e.g., photolithography technique. The photoresist layer 7 does not cover the fourth and fifth metal layers 27, 28. The photoresist layer 7 is formed by first forming a layer of positive photoresist (not shown) on the metal foil 500 and the fourth and fifth metal layers 27, 28, and then disposing a photomask (not shown) over the positive photoresist, followed by exposure and developing. After the developing process, a portion of the photoresist layer 7 which is not on the metal foil 500 located between the fourth metal layer 27 and the fifth metal layer 28 is removed by a developer solution.

In step f), the first solder layers 511, 521 are formed by electroplating. In particular, a solder material is applied on the fourth metal layer 27, the fifth metal layer 28, and the metal foil 500 not covered by the photoresist layer 7 so as to form the first solder layer 511 of the first electrode pad 51 on the fourth metal layer 27 and the metal foil 500 connected to the fourth metal layer 27, and to form the first solder layer 521 of the second electrode pad 52 on the fifth metal layer 28 and the metal foil 500 connected to the fifth metal layer 28. In certain embodiments, each of the first solder layers 511, 521 has a thickness greater than 8 µm. After this, in step g), a stripping process is conducted to remove the photoresist layer 7 to expose the metal foil 500 located between the fourth metal layer 27 and the fifth metal layer 28. In step h), after the photoresist layer 7 is removed, the metal foil 500 located between the fourth metal layer 27 and the fifth metal layer 28 is etched and removed to expose the electrical insulator 4 so as to define the metal foil 500 into the metal foils 510, 520 of the first and second electrode pads 51, 52. To be specific, the metal foil 500 which is connected to the fourth metal layer 27 is defined as the metal foil 510 of the first electrode pad 51, and the metal foil 500 which is connected to the fifth metal layer 28 is defined as the metal foil 520 of the second electrode pad 52.

Figure 6:
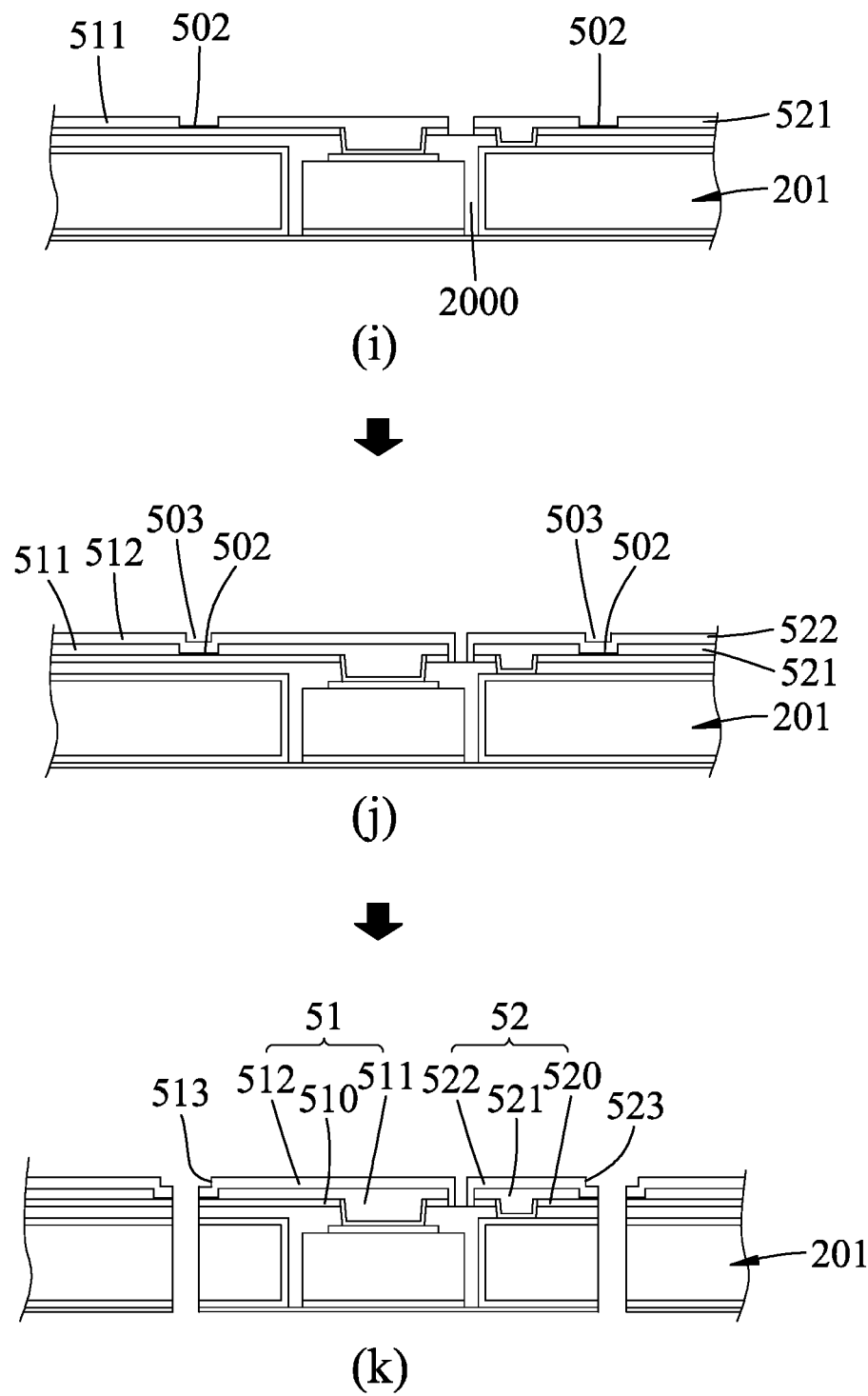

As shown in FIG. 6, step i) is a partial thinning process of the first solder layers 511, 521. In particular, the partial thinning of the first solder layers 511, 521 is implemented using a diamond polishing tool (not shown), so that each of the first solder layers 511, 521 is formed with a first pit 502 which is located outside the through hole 2000 (i.e., not aligned with the through hole 2000). Subsequently, in step j), the second solder layer 512 is formed on the first solder layer 511 of the first electrode pad 51, and the second solder layer 522 is formed on the first solder layer 521 of the second electrode pad 52. Each of the second solder layers 512, 522 is formed with a second pit 503 which aligns with the respective first pit 502. Finally, in step k), the device is vertically diced from the second and first pits 503, 502, so that after the dicing step, the second pit 503 on the second solder layer 512 of the first electrode pad 51 defines the indentation 513 of the first electrode pad 51. Similarly, the second pit 503 of the second electrode pad 52 defines the indentation 523 of the second electrode pad 52. The first embodiment of the chip-scale package device as shown in FIG. 2 is thus obtained.

It is worth noting that the chip-scale package device of the disclosure has a size that is 1.2 times the size of the chip unit 3, which is much smaller than that of the conventional wireless package device 1. Therefore, the chip-scale package device of the disclosure can satisfy the miniature requirements for portable electronic devices. In addition, the space-defining surface 26, which surrounds the chip unit 3, may be used to shield the chip unit 3 from electromagnetic interference (EMI). Further, the chip-scale package device of the disclosure does not have the cantilever structure, and may not have the problem of tilting of the chip unit 12 encountered in the production of the conventional wireless package device 1. Moreover, the indentations 513, 523 are advantageous for reflow of a solder when the chip-scale package device is flipped 180° to be soldered to a circuit board, which may improve an adhesion strength and an electrical connection between the circuit board and the chip-scale package device.

Figure 7:
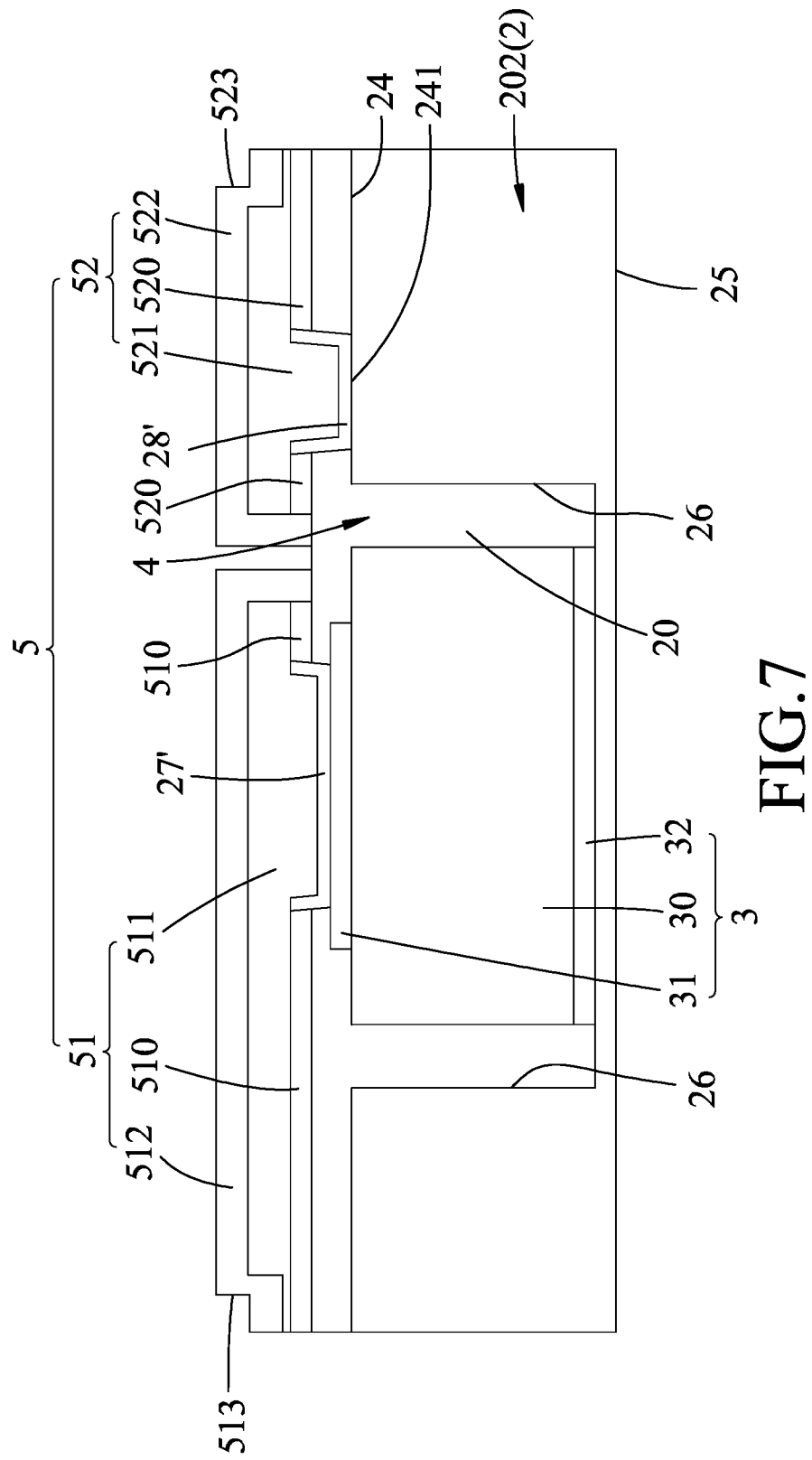
FIG. 7 is a schematic front view of a second embodiment of the chip-scale package device according to the disclosure.

As shown in FIG. 7, a second embodiment of the chip-scale package device according to the disclosure is similar to the first embodiment except that the substrate unit 2 of the second embodiment is a metal substrate 202, and thus, the second embodiment does not include the first, second and third metal layers 21, 22, 23 of the first embodiment.

In this embodiment, the metal substrate 202 has the first surface 24, the second surface 25, and the space-defining surface 26, and the chip-scale package device includes a first metal layer 27' disposed between the first electrode 31 and the first electrode pad 51, and a second metal layer 28' disposed between the exposed region of the first surface 24 and the second electrode pad 52. It should be noted that, the first metal layer 27' of the second embodiment is the same as the fourth metal layer 27 of the first embodiment, and the second metal layer 28' of the second embodiment is the same as the fifth metal layer 28 of the first embodiment.

Figure 8:
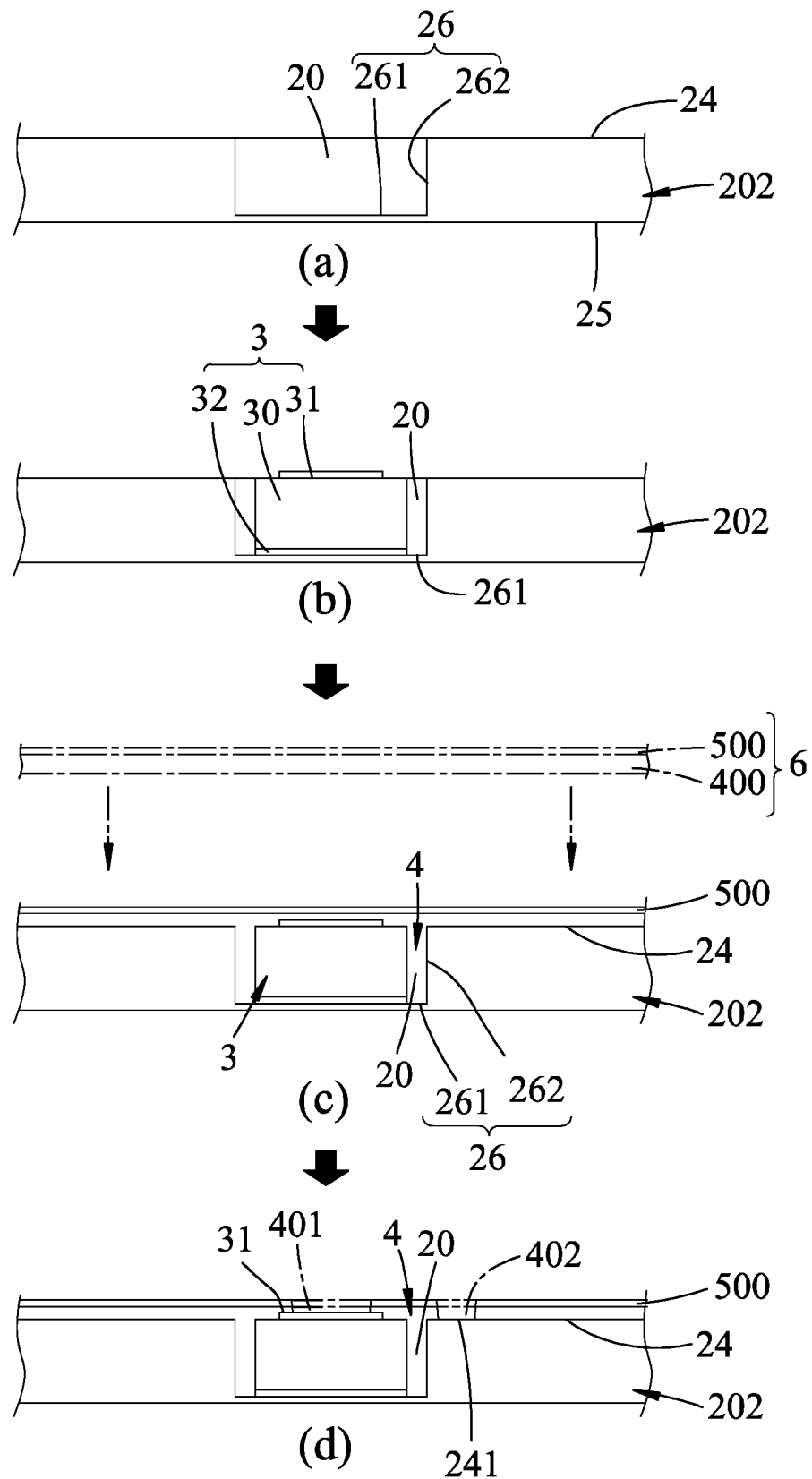
FIGS. 8 to 10 are schematic views illustrating consecutive steps for producing the second embodiment of the chip-scale package device.
Figure 9:
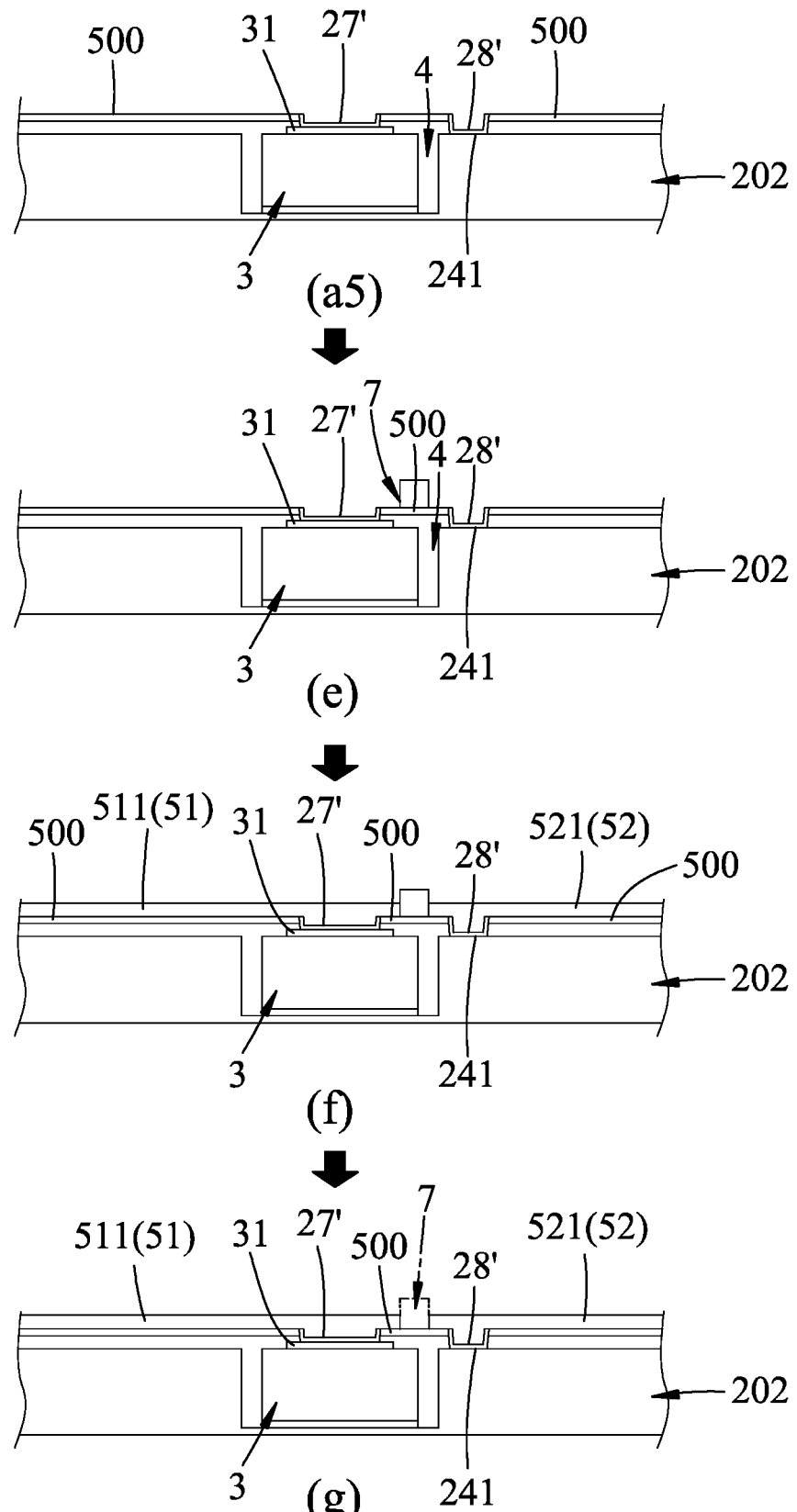
Figure 10:
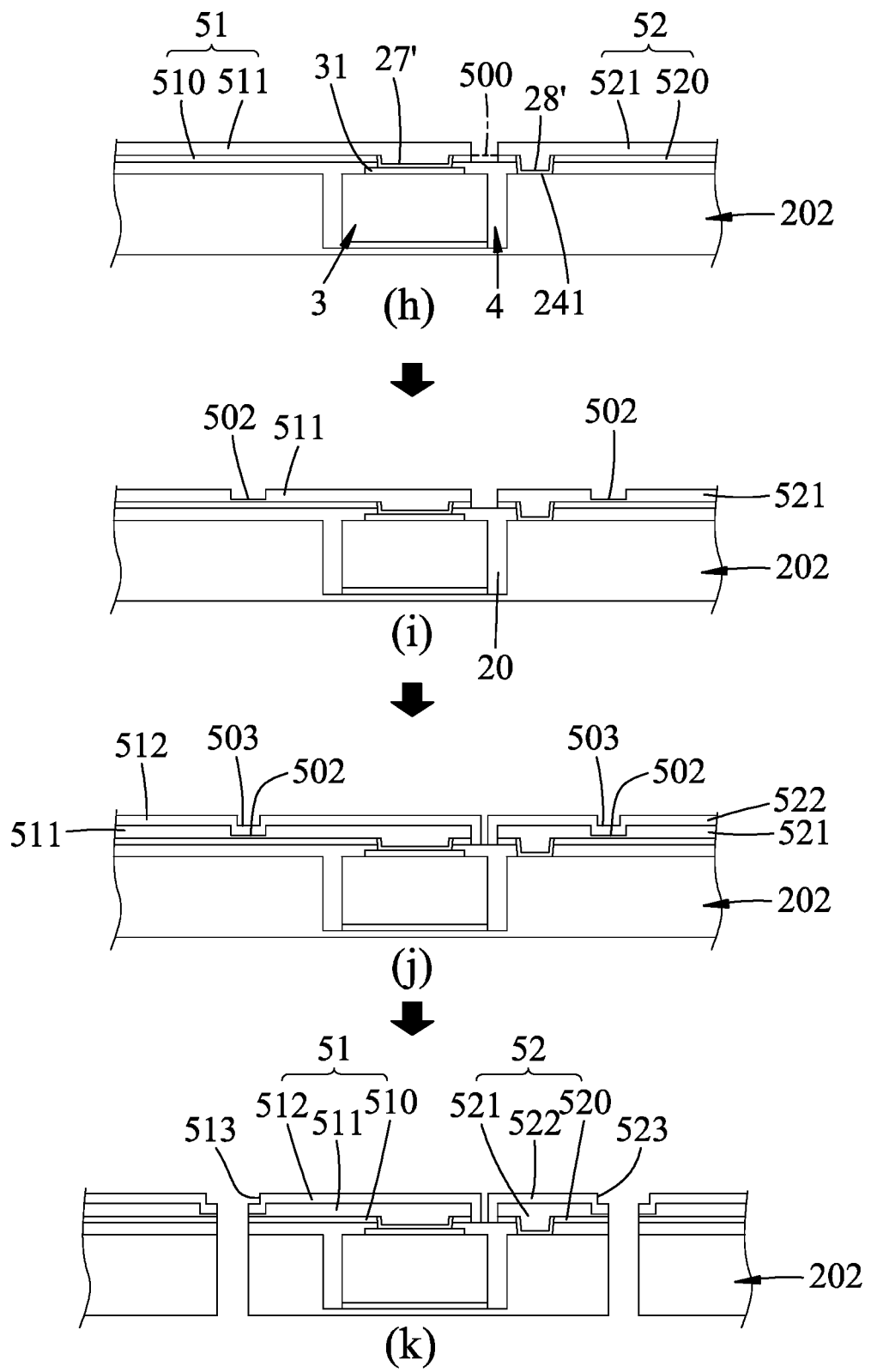

A method for producing the second embodiment of the chip-scale package of the disclosure is illustrated in FIGS. 8 to 10.

As shown in FIG. 8, in step a), a metal board is subjected to laser ablation so as to form the metal substrate 202 with the receiving space 20 defined by the space-defining surface 26. The space-defining surface 26 has a bottom surface 261 and a peripheral surface 262 extending from the bottom surface 261 to the first surface 24. In step b), the chip unit 3 is disposed in the receiving space 20 so that the second electrode 32 is in contact with the bottom surface 261 of the space-defining surface 26. Then, in step c), the electrical insulator 4 is injected into the receiving space 20 to cover the space-defining surface 26 and the chip unit 3. To be specific, the electrical insulator 4 is formed by injecting a polymer material or hot pressing a film structure 6. As shown in FIG. 8, the film structure 6 includes a polymeric prepreg 400 and a metal foil 500 stacked on the polymeric prepreg 400. During the hot pressing procedure, the polymeric prepreg 400 is deformed to fill the receiving space 20 and solidifies to form the electrical insulator 4. The electrical insulator 4 also covers the first surface 24 of the metal substrate 202.

Subsequently, in step d), a first portion 401 and a second portion 402 of the electrical insulator 4 are removed using a laser ablation technique to expose the first electrode 31 and the exposed region 241.

As shown in FIG. 9, in step a5), the first metal layer 27' is formed on the first electrode 31 and a portion of the electrical insulator 4 adjacent to the first electrode 31 so that the first metal layer 27' is connected with the metal foil 500, and the second metal layer 28' is formed on the exposed region 241 and a portion of the electrical insulator 4 adjacent to the exposed region 241 so that the second metal layer 28' is connected with the metal foil 500. The first and second metal layers 27', 28' are formed by chemical plating or sputtering. Subsequently, in step e) a photoresist layer 7 is formed on the metal foil 500 located between the first metal layer 27' and the second metal layer 28' and does not cover the first and second metal layers 27', 28'. The step e) in this method is the same as step e) shown in FIG. 5.

After this, similar to step f) shown in FIG. 5, in step f), the first solder layers 511, 521 are formed by electroplating. The first solder layer 511 of the first electrode pad 51 is formed on the first metal layer 27' and the metal foil 500 connected to the first metal layer 27', and the first solder layer 521 of the second electrode pad 52 is formed on the second metal layer 28' and the metal foil 500 connected to the second metal layer 28'. Then, in step g), a stripping process is conducted to remove the photoresist layer 7 so as to expose the metal foil 500 located between the first metal layer 27' and the second metal layer 28'.

As shown in FIG. 10, in step h), after the photoresist layer 7 is removed, the exposed metal foil 500 located between the first metal layer 27' and the second metal layer 28' is etched and removed to expose the electrical insulator 4 so as to define the metal foil 500 into the metal foils 510, 520 of the first and second electrode pads 51, 52. To be specific, the metal foil 500 which is disposed on the electrical insulator 4 and which is connected to the first metal layer 27' is defined as the metal foil 510 of the first electrode pad 51, and the metal foil 500 which is disposed on the electrical insulator 4 and which is connected to the second metal layer 28' is defined as the metal foil 520 of the second electrode pad 52.

Subsequently, step i), which is the same as step i) shown in FIG. 6, is a partial thinning process of the first solder layers 511, 521 to form the first pits 502. After this, in step j), the second solder layer 512 is formed on the first solder layer 511 of the first electrode pad 51, and the second solder layer 522 is formed on the first solder layer 521 of the second electrode pad 52 so that each of the second solder layers 512, 522 is formed with a second pit 503 which aligns with the respective first pit 502. Finally, in step k), the device is vertically diced from the second and first pits 503, 502, so as to obtain the second embodiment of the chip-scale package device with the indentations 513, 523 (indented toward said substrate unit 2) as shown in FIG. 7. Similar to the first embodiment, the chip-scale package device of the second embodiment has a smaller size. The indentations 513, 523 are advantageous for reflow of a solder and improve an adhesion strength and an electrical connection between the circuit board and the chip-scale package device. The chip-scale package device does not have the tilting problem encountered in the prior art. Moreover, the metal substrate 202 may block electromagnetic interference (EMI).

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A chip-scale package device, comprising:
   a substrate unit having a first surface, a second surface opposite to said first surface, and a receiving space which is an indentation extending from the first surface toward the second surface and which is defined by a space-defining surface;
   a chip unit disposed in said receiving space and surrounded by said space-defining surface, said chip unit including a chip and first and second electrodes disposed oppositely on said chip; and
   an electrical insulator filling said receiving space to cover said space-defining surface and said chip unit such that said first electrode is exposed from said electrical insulator, wherein
   said first surface, said second surface, and said space-defining surface are electrically connected to one another, and
   said second electrode is electrically connected to said space-defining surface,
   said electrical insulator partially covers said first surface of said substrate unit so that said first surface has an exposed region exposed from said electrical insulator,
   said chip-scale package device further includes an electrode pad unit having spaced-apart first and second electrode pads, said first electrode pad covering and being electrically connected with said first electrode which is exposed from said electrical insulator, and said second electrode pad covering and being electrically connected with said exposed region of said first surface,
   said substrate unit includes an insulating layer, a first metal layer, a second metal layer and a third metal layer,
   said insulating layer has opposite upper and lower surfaces, and a through hole extending through said upper and lower surfaces and defined by a hole-defining surface that interconnects said upper and lower surfaces, said first metal layer covering said upper and lower surfaces of said insulating layer and defining said first and second surface of said substrate unit,
   said second metal layer covers said hole-defining surface of said insulating layer, and is connected to said first metal layer on said upper and lower surfaces,
   said third metal layer is connected to said second metal layer and said first metal layer formed on said lower surface of said insulating layer, and is connected to said second electrode so that said second electrode is electrically connected to said first, second, and third metal layers, and
   said second metal layer and said third metal layer cooperatively define said space-defining surface of said substrate unit.

2. The chip-scale package device according to claim 1, further comprising a fourth metal layer disposed between said first electrode and said first electrode pad, and a fifth metal layer disposed between said exposed region of said first surface and said second electrode pad.

3. The chip-scale package device according to claim 2, wherein said first electrode pad covers said fourth metal layer and a portion of said electrical insulator, and said second electrode pad covers said fifth metal layer and another portion of said electrical insulator.

4. The chip-scale package device according to claim 3, wherein each of said first and second electrode pads includes a metal foil, a first solder layer stacked on said metal foil, and a second solder layer stacked on said first solder layer, said metal foil of said first electrode pad being disposed on said electrical insulator and connected to said fourth metal layer, said metal foil of said second electrode pad being disposed on said electrical insulator and connected to said fifth metal layer.

5. The chip-scale package device according to claim 1, wherein each of said first and second electrode pads has an indentation indented toward said substrate unit.

6. A chip-scale package device, comprising:
   a substrate unit having a first surface, a second surface opposite to said first surface, and a receiving space which is an indentation extending from the first surface toward the second surface and which is defined by a space-defining surface;

a chip unit disposed in said receiving space and surrounded by said space-defining surface, said chip unit including a chip and first and second electrodes disposed oppositely on said chip;

an electrical insulator filling said receiving space to cover said space-defining surface and said chip unit such that said first electrode is exposed from said electrical insulator, wherein said first surface, said second surface, and said space-defining surface are electrically connected to one another, said second electrode is electrically connected to said space-defining surface, said electrical insulator partially covers said first surface of said substrate unit so that said first surface has an exposed region exposed from said electrical insulator, said chip-scale package device further includes an electrode pad unit having spaced-apart first and second electrode pads, said first electrode pad covering and being electrically connected with said first electrode which is exposed from said electrical insulator, said second electrode pad covering and being electrically connected with said exposed region of said first surface, and said substrate unit is a metal substrate having said first surface, said second surface and said space-defining surface.

7. The chip-scale package device according to claim 6, further including a first metal layer disposed between said first electrode and said first electrode pad, and a second metal layer disposed between said exposed region of said first surface and said second electrode pad.

8. The chip-scale package device according to claim 7, wherein each of said first and second electrode pads includes a metal foil, a first solder pad stacked on said metal foil, and a second solder pad stacked on said first solder pad, said metal foil of said first electrode pad being disposed on said electrical insulator and connected to said first metal layer, said metal foil of said second electrode pad being disposed on said electrical insulator and connected to said second metal layer.

9. The chip-scale package device according to claim 8, wherein each of said first and second electrode pads has an indentation indented toward said substrate unit.

\* \* \* \* \*